(12) United States Patent
Bolandrina et al.

(10) Patent No.: US 7,646,644 B2
(45) Date of Patent: Jan. 12, 2010

(54) NONVOLATILE MEMORY DEVICE WITH MULTIPLE REFERENCES AND CORRESPONDING CONTROL METHOD

(76) Inventors: Efrem Bolandrina, Via Cedrali, 5, Fiorano Al Serio (IT) 24020; Daniele Vimercati, Via Martin Luther King, 10, Carate Brianza (IT) 20048; Corrado Villa, Via S. Francesco, 31, Sovico (IT) 20050

( * ) Notice: Subject to any disclaimer, the term of this patent is extended or adjusted under 35 U.S.C. 154(b) by 281 days.

(21) Appl. No.: 11/460,531

(22) Filed: Jul. 27, 2006

(65) Prior Publication Data

US 2007/0036014 A1 Feb. 15, 2007

(30) Foreign Application Priority Data

Jul. 29, 2005 (EP) .................................. 05425564

(51) Int. Cl.
*G11C 16/26* (2006.01)
*G11C 7/14* (2006.01)
(52) U.S. Cl. .............................. 365/185.2; 365/185.11; 365/210.1
(58) Field of Classification Search ............ 365/185.11, 365/185.2, 210.1, 185.22, 185.24, 185.3
See application file for complete search history.

(56) References Cited

U.S. PATENT DOCUMENTS

| | | | |
|---|---|---|---|
| 5,596,527 A | 1/1997 | Tomioka et al. | 365/185.2 |
| 5,917,753 A * | 6/1999 | Dallabora et al. | 365/185.21 |
| 6,075,738 A | 6/2000 | Takano | 365/210 |
| 6,094,368 A | 7/2000 | Ching | 365/49 |
| 6,339,556 B1 * | 1/2002 | Watanabe | 365/185.2 |
| 6,459,620 B1 * | 10/2002 | Eshel | 365/185.21 |
| 6,469,929 B1 * | 10/2002 | Kushnarenko et al. | 365/185.06 |
| 2002/0015326 A1 * | 2/2002 | Rolandi et al. | 365/185.2 |
| 2002/0181284 A1 * | 12/2002 | Kato | 365/185.21 |
| 2004/0042314 A1 * | 3/2004 | Hashimoto et al. | 365/222 |
| 2005/0174868 A1 * | 8/2005 | Anzai et al. | 365/210 |

* cited by examiner

*Primary Examiner*—Anh Phung
*Assistant Examiner*—Douglas King
(74) *Attorney, Agent, or Firm*—Schwabe Williamson & Wyatt

(57) ABSTRACT

A memory device includes a group of memory cells organized in rows and columns and a first addressing circuit for addressing said memory cells of said group on the basis of a cell address. The device further includes a plurality of sets of reference cells, associated to the group, each of said set having a plurality of reference cells, and a second addressing circuit for addressing one of the reference cells during operations of read and verify of addressed memory cells.

24 Claims, 5 Drawing Sheets

NONVOLATILE MEMORY DEVICE WITH
MULTIPLE REFERENCES AND
CORRESPONDING CONTROL METHOD

BACKGROUND OF THE INVENTION

1. Field of the Invention

The present invention relates to a nonvolatile memory device with multiple references and to a control method thereof.

2. Description of the Related Art

It is known that reading nonvolatile memory cells, for example of an EEPROM or Flash type, may cause undesirable phenomena of spurious programming (referred to also as "read disturb"). With reference to FIG. 1, a nonvolatile memory cell 1 comprises: a source region 2 and a drain region 3, both formed in a semiconductor substrate 4 and respectively provided with a source terminal 1$a$ and a drain terminal 1$b$; a channel region 5, extending in the substrate 4 between the source region 2 and the drain region 3; a floating-gate region 6, separated from the channel region 5 by a tunnel-oxide layer 7; and a control-gate region 8, which is in turn separated from the floating-gate region 6 by an insulating layer 9 and is provided with a gate terminal 1$c$. During read or verify operations, an electric field E is set up between the floating-gate region 6 and the substrate 4 (in particular, the channel region 5). Said electric field E is necessary to enable passage of current between the source region 2 and the drain region 3. However, a mechanism altogether similar to that of programming causes a fraction of the electrons traveling in the channel region 5 to be deviated and trapped in the floating-gate region 6, thus altering the threshold voltage of the cell 1. The phenomenon of spurious programming is all the more effective the lower the threshold voltage of the cell 1 (since the electric field E is greater) and regards above all the cells used as reference for the read operations, program-verify operations, erase-verify operations, and depletion-verify operations. In fact, whereas the array cells are randomly selected for reading/programming, the reference cells are systematically used at every access to the memory. Consequently, the reference cells are read a number of times that is greater by some orders of magnitude than the average number of accesses to the individual array cell.

In practice, two harmful effects occur. The first, illustrated in FIGS. 2$a$ and 2$b$ in the case of a four-level (two-bit) cell, regards the reduction in the distance that separates the ranges of threshold voltages associated to the various levels (designated by $V_{T1}$, $V_{T2}$, $V_{T3}$ and $V_{T4}$) and between the references (the read references, the program-verify references, the erase-verify reference, and the depletion-verify reference, are designated, respectively, by $V_{R1}$, $V_{R2}$, $V_{R3}$, by $V_{P1}$, $V_{P2}$, $V_{P3}$, by $V_E$, and by $V_D$). In fact, the cells having a lower threshold voltage are subject to a more intense drift, due to spurious programming, and hence, with time, the reference ranges and levels tend to be compressed (FIG. 2$b$) as compared to an initial situation (FIG. 2$a$). The number of reading errors consequently tends to increase, even following upon modest disturbance.

The second effect, which is more serious, depends upon the higher reading frequency of the reference cells and is illustrated in FIGS. 2$a$ and 2$c$. The drift in the threshold voltages of the reference cells, in fact, is faster as compared to that of the array cells. Consequently, with respect to the initial situation of FIG. 2$a$, the threshold voltages of the reference cells can overlap the intervals associated to the levels admissible for the array cells. In this case, systematic reading errors arise.

Even though the one-bit cells also suffer from the problem described above, said problem is much more serious in multilevel memories, because the levels are closer to one another and the margins narrow.

BRIEF SUMMARY OF THE INVENTION

One embodiment of the present invention provides a nonvolatile memory device and a control method thereof that are free from the drawbacks described. One embodiment of the present invention, is directed to a nonvolatile memory device that includes an array of memory cells organized in rows and columns, a first addressing circuit for addressing the memory cells of the array on the basis of a cell address, and a plurality of sets of reference cells associated with the array. Each set of reference cells includes a plurality of reference cells. The memory device further comprises a second addressing circuit for addressing one of the reference cells during operations of read and verify of addressed memory cells.

One embodiment of the invention provides a control method for a memory device, the method comprising the steps of addressing memory cells organized in rows and columns in an array on the basis of a cell address, associating a plurality of sets of reference cells with said array, and addressing one of said reference cells during read and verify operations of addressed memory cells.

BRIEF DESCRIPTION OF THE SEVERAL
VIEWS OF THE DRAWING(S)

For a better understanding of the invention, some embodiments thereof are now described, purely by way of non-limiting example and with reference to the attached plate of drawings, wherein:

FIG. 1 shows a cross section through a nonvolatile memory cell of a known type;

FIGS. 2$a$-2$c$ are graphs that show the behavior of quantities corresponding to nonvolatile memory devices of a known type;

DETAILED DESCRIPTION OF THE INVENTION

Figure 1:
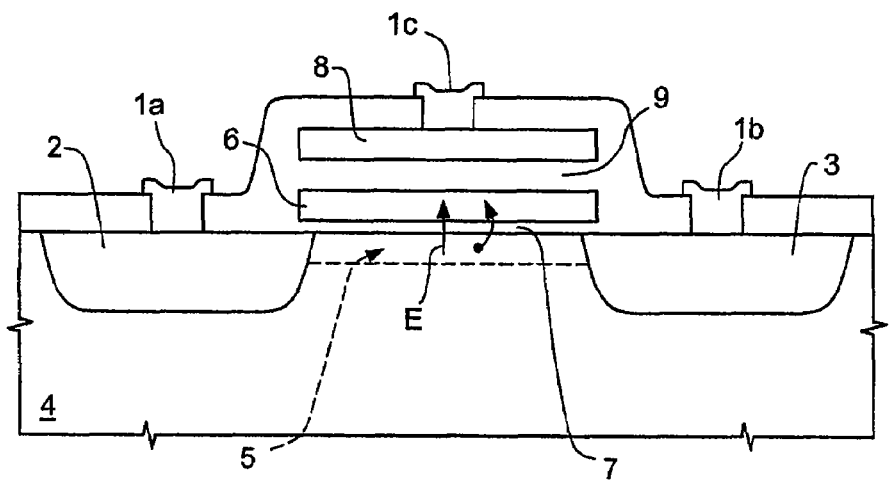
Figure 2A:
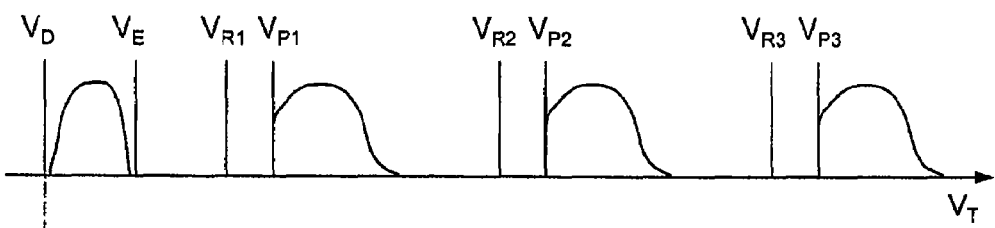
Figure 2B:
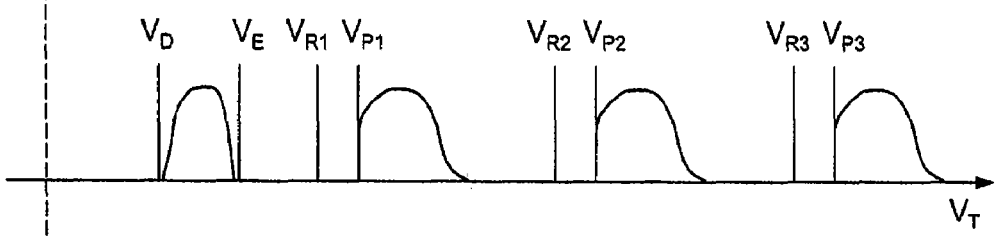
Figure 2C:
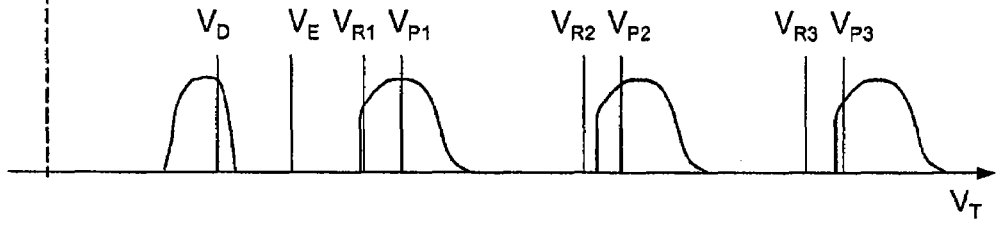
Figure 3:
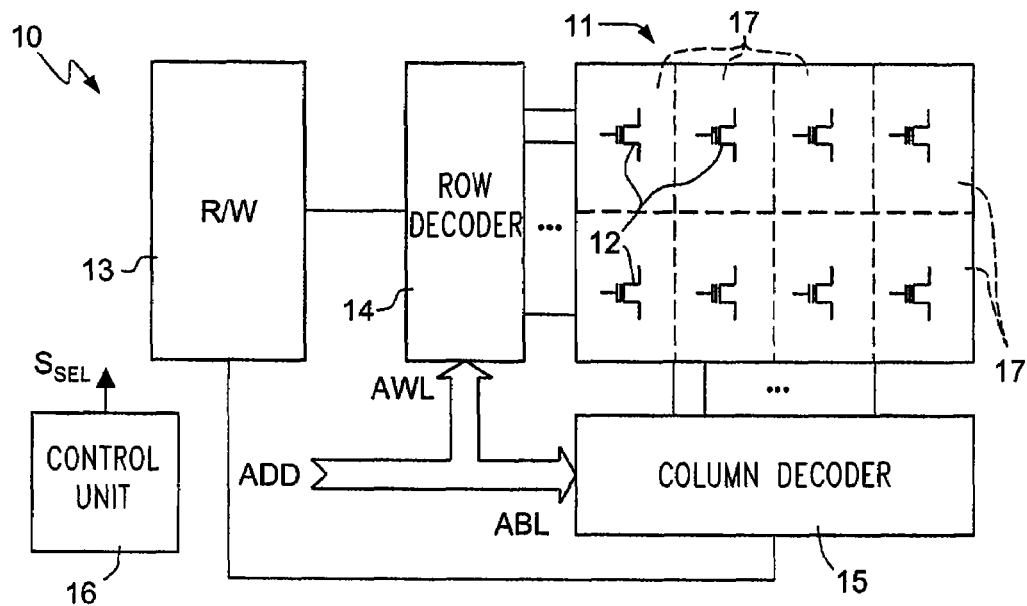
FIG. 3 is a simplified block diagram of a nonvolatile memory device according to a first embodiment of the present invention.

With reference to FIG. 3, a nonvolatile memory device, designated as a whole by 10, comprises: an array 11 of memory cells 12, organized in rows and columns; a read/write (R/W) circuit 13; a row-decoder stage 14; a column-decoder stage 15; and a control unit 16. In one embodiment of the invention, the cells 12 are of the two-bit multilevel type (four levels). The row-decoder stage 14 and the column-decoder stage 15 select, in ways in themselves known, one or more memory cells 12 for read and/or program operations, using a row address AWL and a column address ABL, respectively, which form a cell address ADD supplied from the outside via an address bus (which is also known and not shown).

Figure 4:
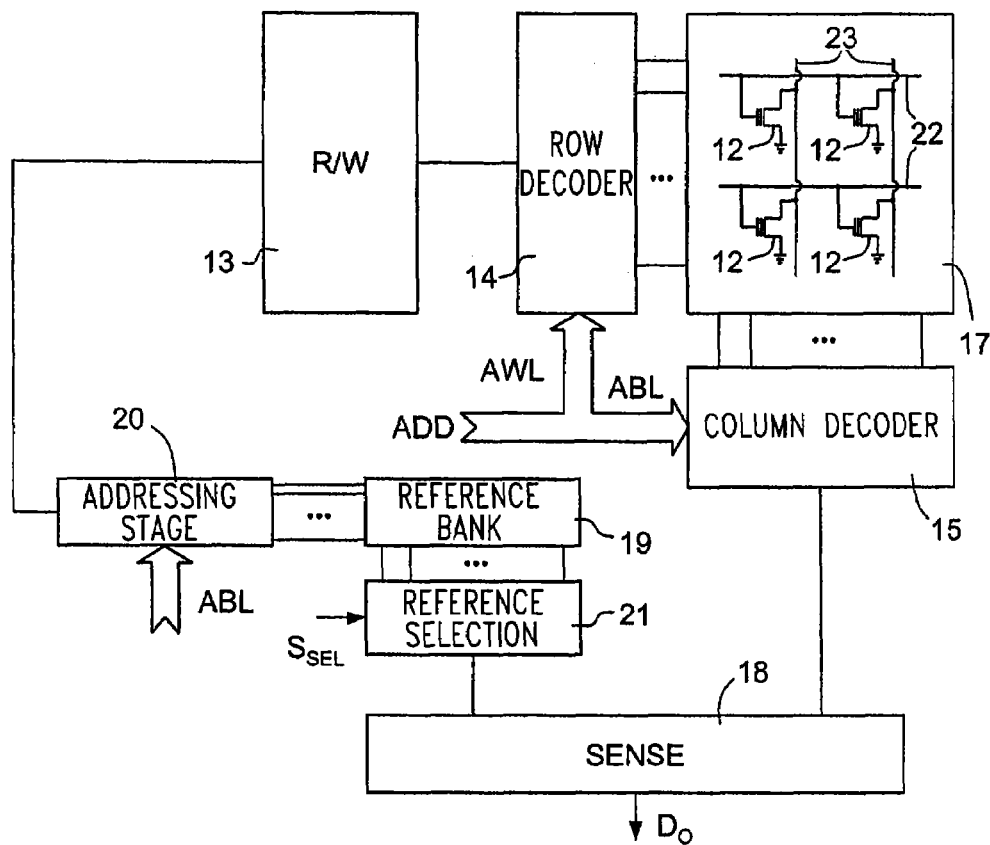
FIG. 4 is a more detailed block diagram of a part of the device of FIG. 3.

In order to render access to the memory cells 12 more flexible, the array 11 is split into banks or partitions 17 independent with respect to one another (eight in the embodiment described herein). As shown in FIG. 4, a dedicated reference bank 19, an addressing stage 20, a reference-selection circuit 21, and a sense circuit 18 are associated to each of the partitions 17. While FIG. 4 shows one reference bank 19 and one partition 17, there are a plurality of reference banks associated respectively with the partitions 17 in one embodiment. For reasons of simplicity, in FIG. 4 and in the following description reference will be made to just one sense circuit 18. It is, however, understood that each partition 17 can comprise more than one sense circuit 18 (for example 128 sense circuits) in order to enable simultaneous access to as many memory cells 12 for read or program operations in parallel.

Also the partitions 17 and the memory cells 12 are organized in rows and columns. In greater detail, memory cells 12 arranged on a same row are connected to a same array wordline 22, and memory cells 12 arranged on a same column are connected to a same array bitline 23. The row-decoder stage 14 is configured for connecting selectively one of the array wordlines 22 of the partition 17 to the R/W circuit 13. Likewise, the column-decoder stage 15 is configured so as to connect selectively one (or a set) of the array bitlines 23 to the sense circuit 18.

Figure 5:
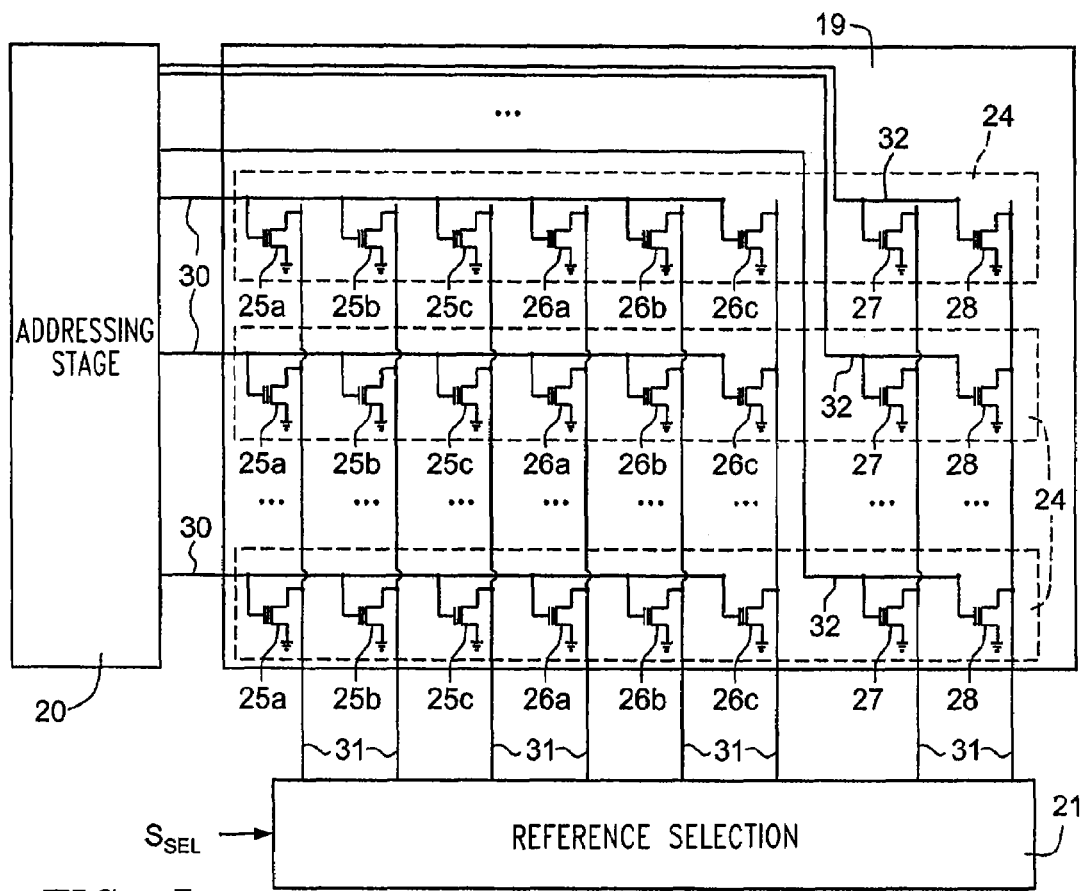
FIG. 5 shows a simplified circuit diagram corresponding to one of the blocks of FIG. 4.

As shown in FIG. 5, the reference bank 19 comprises a plurality of sets 24 of reference cells organized in rows (for example 4, 8, 16 or 32). In particular, each set 24 of reference cells comprises three read reference cells 25a, 25b, 25c (namely, one for each read reference level), three program-verify reference cells 26a, 25b, 26c (namely, one for each program-verify level), one erase-verify reference cell 27 and one depletion-verify reference cell 28. The number of read reference cells and program-verify reference cells indicated regards the example described herein, in which the memory cells 12 are of the four-level type; i.e., they are capable of storing two bits each. In general, in the case of memory cells having M levels, each set of reference cells comprises M−1 read reference cells and M−1 program-verify reference cells.

According to the embodiment described herein, in each set 24 of reference cells, the read reference cells 25a-25c and the program-verify reference cells 26a-26c have their respective gate terminal connected to a same first reference wordline 30 and their drain terminal connected to respective reference bitlines 31. Furthermore, the erase-verify reference cell 27 and the depletion-verify reference cell 28 of each set 24 of reference cells have their respective gate terminals connected to a same second reference wordline 32, separated from the first reference wordline 30. The drain terminals of the erase-verify reference cell 27 and of the depletion-verify reference cell 28 are, instead, connected to respective bitlines 31. In one embodiment (not illustrated), the reference cells of each set 24 of reference cells all have their respective gate terminals connected to a same reference wordline.

The first and second reference wordlines 30, 32 of all the sets 24 of reference cells are connected to the addressing stage 20, whereas the reference bitlines 31 are connected to the reference-selection stage 21.

With reference once again to FIG. 4, the reference-selection stage 21 is controlled by the control unit 16 by means of a selection signal $S_{SEL}$ so as to connect one of the reference bitlines 31 to the sense circuit 18, according to the type of operation to be carried out. For example, during a read step, the selection signal $S_{SEL}$ operates on the reference-selection stage 21 such that the sense circuit 18 is coupled to the reference bitline 31 connected to one of the read reference cells 25a-25c. Likewise, during a program-verify step, the reference-selection stage 21 couples the sense circuit 18 to the bitline connected to one of the program-verify reference cells 26a-26c.

The addressing stage 20 receives the column address ABL from the address bus (not shown) and is configured for selectively connecting one of the first reference wordlines 30 or of the second reference wordlines 32 to the R/W circuit 13 on the basis of the column address ABL (in particular, using a number of address bits equal to $\log_2 N$).

Consequently, the sense circuit 18 has a first sense terminal 18a, addressably connectable to one of the array cells 12, and a second sense terminal 18b, addressably connectable to one of the reference cells 25a-25c, 26a-26c, 27, 28 of the reference bank 19. Once the first and second terminals 18a, 18b have been connected, under the guidance of the control unit 16 the sense circuit 18 reads or verifies the contents of the memory cell 12 selected, according to the type of operation, and supplies at output read data $D_0$.

Figure 6:
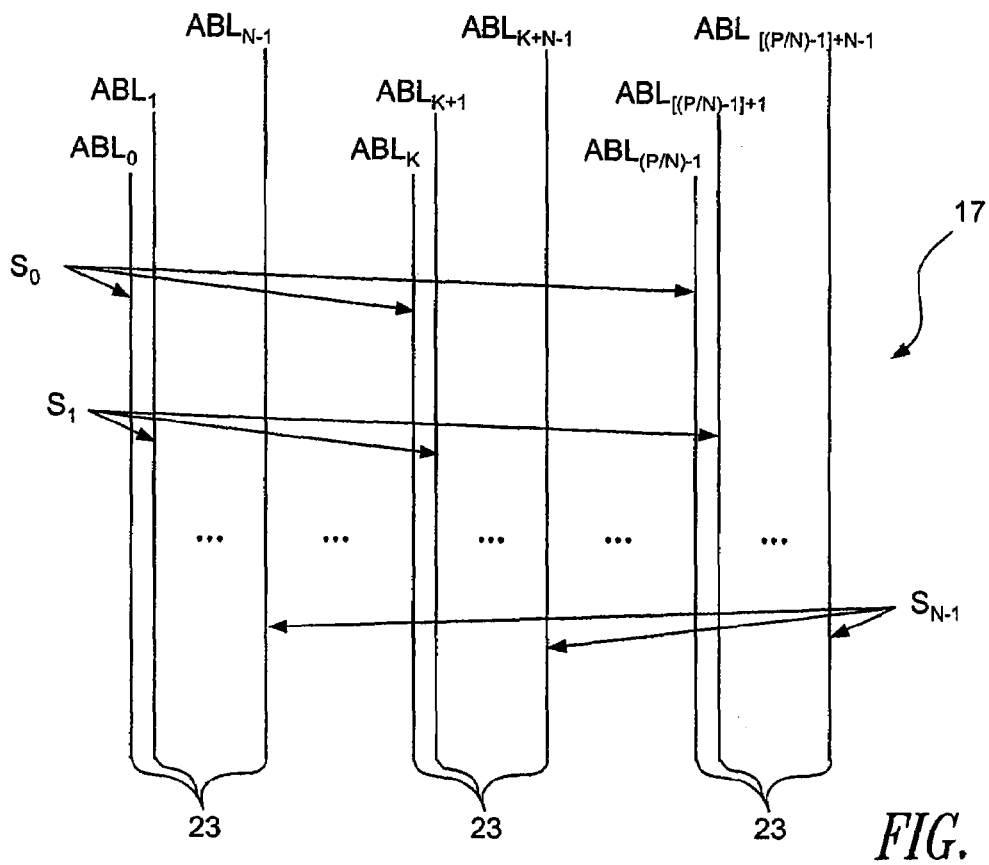
FIG. 6 is a logic diagram corresponding to a part of the device of FIG. 3.

In one embodiment, the selection is carried out as follows. The sets 24 of reference cells are associated to respective sets $S_0, S_1, \ldots, S_{N-1}$ of memory cells of the partition 17 of the array 11, defined by predetermined groups of array bitlines 23 (N designates the number of sets 24 of reference cells belonging to each of the reference banks 19). In one embodiment, each set $S_0, S_1, \ldots, S_{N-1}$ of memory cells comprises the memory cells of one array bitline 23 every N. As shown in FIG. 6 (where the array wordlines 22 are not illustrated, for reasons of simplicity), each partition 17 is hence logically split into N sets $S_0, S_1, \ldots, S_{N-1}$ Of memory cells, which are defined by array bitlines 23 having column addresses $ABL_{NK}$, $ABL_{NK+1}, \ldots, ABL_{NK+N-1}$, respectively, with K=0, 1, ..., (P/N)−1 (where P is the total number of array bitlines 23 of each partition 17 and is an integer multiple of N). For example, the set $S_5$ of memory cells comprises the memory cells connected to array bitlines 23 having column addresses $ABL_5, ABL_{N+5}, ABL_{2N+5}, \ldots, ABL_{[(P/N)-1]+5}$. Once a memory cell 12 belonging to one of the sets $S_0, S_1, \ldots, S_{N-1}$ of memory cells is selected, the addressing stage 20 selects the first reference wordline 30 or the second reference wordline 32 of the corresponding set 24 of reference cells, according to the type of operation that must be performed (read operation or program-verify operation in the first case, and erase-verify operation or depletion-verify operation in the second case).

The memory device described advantageously enables a reduction in the effects of spurious programming of the reference cells. In fact, since each partition 17 of the memory array 11 is provided with a plurality (N) of sets 24 of reference cells that are alternatively used in the read and verify operations, in practice, the average number of accesses to any one of the read reference cells 25a-25c, of the program-verify reference cells 26a-26c, of the erase-verify reference cells 27 and of the depletion-verify reference cells 28 is reduced by N times. The adverse effects of read disturb are reduced by the same amount.

Furthermore, the logic division of the partitions 17 into sets $S_0, S_1, \ldots, S_{N-1}$ of memory cells as described above allows optimizing of the alternation and renders use of the sets 24 of reference cells uniform in the frequent case of page read/write ("burst mode") of the memory cells 12. In this case, in fact, the memory cells 12 are accessed starting from an initial address and incrementing the column address ABL by one unit at each cycle. Consequently, the sets 24 of reference cells are selected cyclically in sequence. Thus, uneven use of the reference cells 25a-25c, 26a-26c, 27, 28 of the various sets 24 of reference cells is prevented.

Addressing of the reference cells 25a-25c, 26a-26c is based upon the use of a portion of the address ADD of the memory cell 12 selected for the read or verify operation to be carried out. In this way, associated to each memory cell 12 is always a same set 24 of reference cells.

A further advantage of the memory device described derives from the use of separate reference wordlines for the read reference cells 25a-25c and program-verify reference cells 26a-26c on the one hand and for the erase-verify reference cells 27 and depletion-verify reference cells 28 on the other. In this way, in fact, the erase-verify reference cells 27 and the depletion-verify reference cells 28, which have lower threshold voltages and are more subject to read disturb, are more protected.

Figure 9:
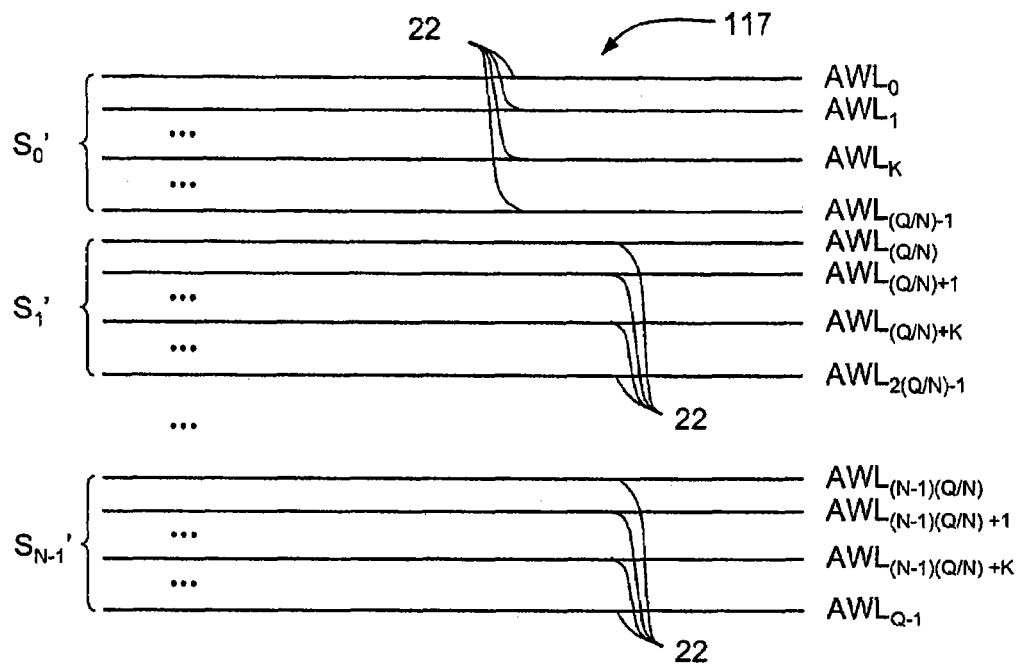
FIG. 9 is a logic diagram corresponding to a part of the device of FIG. 7.
Figure 7:
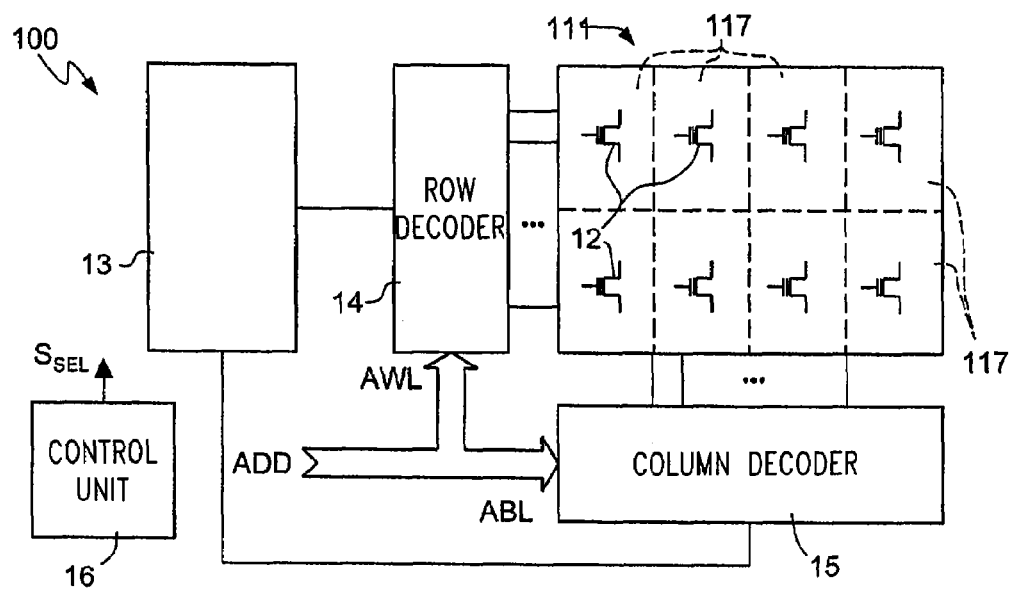
FIG. 7 is a simplified block diagram of a nonvolatile memory device made according to a second embodiment of the present invention.
Figure 8:
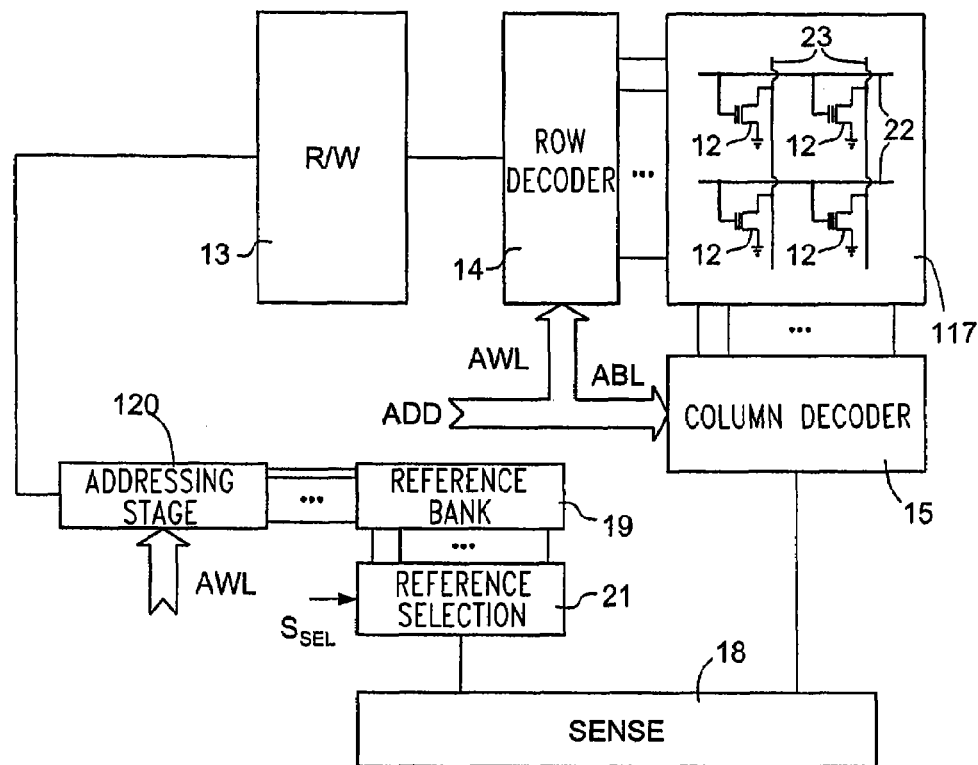
FIG. 8 is a more detailed block diagram of a part of the device of FIG. 7.

FIGS. 7-9, where parts that are the same as those already shown are designated by the same reference numbers previously used, shows a nonvolatile memory device 100 made according to one embodiment of the invention. The memory device 100 comprises an array 111 of memory cells 12, split into partitions 117, the R/W circuit 13, the row-decoder stage 14, the column-decoder stage 15, and the control unit 16.

A plurality of dedicated reference banks 19, having the structure already described with reference to FIG. 5, are respectively associated with each partition 117 of the array 111 (FIG. 8). Furthermore, at least one sense circuit 18, an addressing stage 120, and a reference-selection stage 21 are associated to each of the partitions 117. The reference-selection stage 21 and the sense circuit 18 are of the types already described and illustrated in FIG. 4. The addressing stage 120 receives the row address AWL from the address bus (not shown) and is configured for connecting selectively one of the first reference wordlines 30 or of the second reference wordlines 32 of the reference bank 19 to the R/W circuit 13 on the basis of the row address AWL (in particular, using a number of address bits equal to $\log_2 N$).

As shown in FIG. 9 (where the array bitlines 23 are not illustrated, for reasons of simplicity), the sets 24 of reference cells are in this case associated to respective sets $S_0'$, $S_1'$, ..., $S_{N-1}'$ of memory cells of the partition 17 of the array 11, defined by predetermined groups of array wordlines 22 (N once again designates the number of sets 24 of reference cells belonging to each of the reference banks 19). In one embodiment, each set $S_0'$, $S_1'$, ..., $S_{N-1}'$ of memory cells comprises the memory cells of Q/N adjacent array wordlines 22, Q being the number of array wordlines 22 of each partition 117 (Q is an integer multiple of N). Consequently, each partition 17 is logically split into N sets $S_0'$, $S_1'$, ..., $S_{N-1}'$, of memory cells which include the memory cells connected to array wordlines 22 having row addresses $AWL_K$, $AWL_{(Q/N)+K}$, ..., $AWL_{(N-1)(Q/N)+K}$, respectively, with K=0, 1, ..., (Q/N)−1. Once a memory cell 12 belonging to one of the sets $S_0'$, $S_1'$, ..., $S_{N-1}'$ of memory cells is selected, the addressing stage 120 selects the first reference wordline 30 or the second reference wordline 32 of the corresponding set 24 of reference cells, according to the type of operation that must be performed (read operation or program-verify operation in the first case, and erase-verify operation or depletion-verify operation in the second case).

With reference once again to FIGS. 7 and 8, the reference-selection stage 21 is controlled by the control unit 16 by means of a selection signal $S_{SEL}$ so as to connect one of the reference bitlines 31 to the sense circuit 18, according to the type of operation to be carried out, as already described with reference to FIG. 4.

Also in this case, the first terminal 18a and the second terminal 18b of the sense circuit 18 are addressably connectable to one of the array cells 12 and to one of the reference cells 25a-25c, 26a-26c, 27, 28 of the reference bank 19, respectively.

Figure 10:
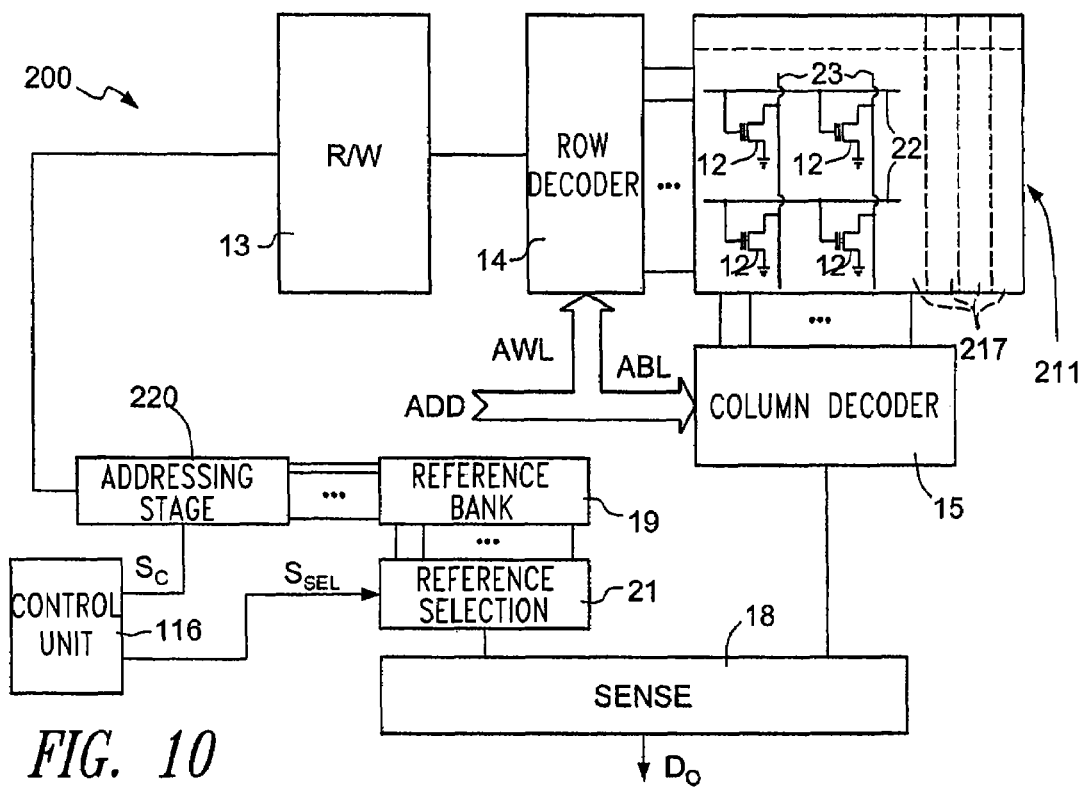
FIG. 10 is a simplified block diagram of a nonvolatile memory device made according to a third embodiment of the present invention.

According to one embodiment of the invention, illustrated in FIG. 10, in a memory device 200 an array 211 of memory cells 12 is split into partitions 217. A respective dedicated reference bank 19, having the structure already described with reference to FIG. 5, at least one sense circuit 18, an addressing stage 220, and a reference-selection stage 21 are associated to each of the partitions 217. The addressing stage 220 is driven by the control unit 16 by a control signal $S_C$ for selecting one of the sets 24 of reference cells at each access to the partition 217 of the array 211 according to a predetermined procedure. For example, the selection can occur in a sequential way or else by means of a random-access algorithm.

Finally, it is clear that modifications and variations may be made to the device and the method described herein, without departing from the scope of the present invention, as defined in the annexed claims.

The invention claimed is:

1. A memory device comprising:
   a plurality of groups of memory cells organized in rows and columns;
   a first addressing circuit for addressing said memory cells of said groups on the basis of a cell address;
   a plurality of sets of reference cells associated with respective sets of said memory cells, each set of reference cells including a plurality of reference cells, wherein in each set of reference cells, a read reference cell and a program verify reference cell are connected to a same first reference wordline, and an erase verify reference cell and a depletion verify reference cell are connected to a same second reference wordline, and wherein said read reference cell, said program-verify reference cell, said erase-verify reference cell, and said depletion verify reference cell are connected to respective separate bitlines; and
   a second addressing circuit for addressing one of said reference cells through at least one reference wordline and respective bitlines during read and verify operations of addressed memory cells, wherein said second addressing circuit comprises an addressing stage for selecting one of said reference wordlines, and a reference-selection circuit for selecting one of said reference bitlines.

2. The device of claim 1, wherein a respective plurality of said sets of reference cells is associated with each of said groups of memory cells.

3. The device of claim 2, wherein memory cells arranged on a same row are connected to a same array wordline, and memory cells arranged on a same column are connected to a same array bitline, and wherein each of said groups is split into a plurality of sectors of memory cells and a respective one of said sets of reference cells is associated with each of said sectors.

4. The device of claim 3, wherein each of said sectors of memory cells comprises a plurality of said array bitlines.

5. The device of claim 4, wherein each of said sectors of memory cells comprises one of said array bitlines every N, where N is a number of said sets of reference cells associated with said group.

6. The device according to claim 3, wherein each of said sets of memory cells comprises the memory cells connected to a plurality of said array wordlines.

7. The device according to claim 6, wherein each of said sets of memory cells comprises the memory cells connected to Q/N adjacent said array wordlines, where N is a number of said sets of reference cells associated with said partition and Q is the number of array wordlines associated with said partition.

8. The device of claim 1, wherein said second addressing circuit is configured to address said reference cells on the basis of a column portion of said cell address.

9. The device according to claim 1, wherein said second addressing circuit is configured to address said reference cells on the basis of a row portion of said cell address.

10. The device of claim 1, wherein said memory cells are multilevel nonvolatile memory cells.

11. The device of claim 1, further comprising at least one sense circuit associated with each of said groups of memory cells, each sense circuit having a first sense terminal addressably connectable to one of said memory cells by said first addressing circuit.

12. The device of claim 11, wherein each of said sets of reference cells comprises M−1 read reference cells, M−1 program-verify reference cells, an erase-verify reference cell, and a depletion-verify reference cell, M being a number of memory levels for each of the memory cells.

13. The device of claim 12, wherein said sense circuit has a second sense terminal addressably connectable to one of said sets of reference cells by said second addressing circuit.

14. A control method for a memory device, the method comprising the steps of:
addressing, using a first addressing circuit, memory cells organized in rows and columns in a plurality of groups on the basis of a cell address;
associating the at least one sense circuit to each of said groups;
associating a plurality of sets of reference cells with respective groups of memory cells of said array, each set comprising a plurality of reference cells connectable to a second addressing circuit through at least one reference wordline and respective bitlines, wherein in each set of reference cells, a read reference cell and a program verify reference cell are connected to a same first reference wordline, and an erase verify reference cell and a depletion verify reference cell are connected to a same second reference wordline, and wherein said read reference cell, said program-verify reference cell, said erase-verify reference cell, and said depletion-verify reference cell are connected to respective separate bitlines; and
addressing one of said reference cells, during read and verify operations of addressed memory cells by selecting, using an addressing stage of a second addressing circuit, one of said reference wordlines, and selecting, using a reference-selection circuit of the second addressing circuit one of said reference bitlines.

15. The method of claim 14, wherein said addressing one of said reference cells comprises using a column portion of said cell address.

16. The method according to claim 14, wherein said step of addressing one of said reference cells comprises using a row portion of said cell address.

17. The method of claim 14, wherein memory cells arranged on a same row are connected to a same array wordline, and memory cells arranged on a same column are connected to a same array bitline, the method further comprising:
splitting said groups into a plurality of sectors of memory cells; and
associating a respective one of said sets of reference cells with each of said sectors of memory cells.

18. The method of claim 17, wherein each of said sectors of memory cells comprises a plurality of said array bitlines.

19. The method of claim 18, wherein each of said sectors of memory cells comprises one of said array bitlines every N, where N is a number of said sets of reference cells associated with said array.

20. The method according to claim 17, wherein each of said sets of memory cells comprises the memory cells connected to a plurality of said array wordlines.

21. The method according to claim 20, wherein each of said sets of memory cells comprises the memory cells connected to Q/N adjacent said array wordlines, where N is a number of said sets of reference cells associated to said array and Q is the number of array wordlines in the array.

22. The method of claim 14, wherein said addressing one of said reference cells comprises addressably connecting, using the first addressing circuit, a first sense terminal of at least one sense circuit to one of said memory cells.

23. The method of claim 22, further comprising providing M−1 read references cells, M−1 program-verify reference cells, an erase-verify reference cell, and a depletion-verify reference cell in each of said sets of reference cells, M being a number of memory levels for each of the memory cells.

24. The method of claim 23, further comprising addressably connecting, using the second addressing circuit, a second sense terminal of said sense circuit to one of said sets of reference cells.

* * * * *

UNITED STATES PATENT AND TRADEMARK OFFICE
CERTIFICATE OF CORRECTION

PATENT NO. : 7,646,644 B2
APPLICATION NO. : 11/460531
DATED : January 12, 2010
INVENTOR(S) : Bolandrina et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 302 days.

Signed and Sealed this

Sixteenth Day of November, 2010

David J. Kappos
*Director of the United States Patent and Trademark Office*